(12) United States Patent
Mei et al.

(10) Patent No.: US 6,493,867 B1
(45) Date of Patent: Dec. 10, 2002

(54) DIGITAL PHOTOLITHOGRAPHY SYSTEM FOR MAKING SMOOTH DIAGONAL COMPONENTS

(75) Inventors: Wenhui Mei, Plano, TX (US); Takashi Kanatake, Dallas, TX (US)

(73) Assignee: Ball Semiconductor, Inc., Allen, TX (US)

(*) Notice: Subject to any disclaimer, the term of this patent is extended or adjusted under 35 U.S.C. 154(b) by 26 days.

(21) Appl. No.: 09/712,730

(22) Filed: Nov. 14, 2000

Related U.S. Application Data

(63) Continuation of application No. 09/633,978, filed on Aug. 8, 2000.

(51) Int. Cl.[7] .............................................. G06F 17/50
(52) U.S. Cl. ...................... 716/21; 369/44.12; 369/116
(58) Field of Search ............................ 347/239; 716/1, 716/2, 20, 21; 369/44.12, 116

(56) References Cited

U.S. PATENT DOCUMENTS

| | | | |
|---|---|---|---|
| 3,534,467 A | 10/1970 | Sachs et al. ................... 29/583 |
| 4,126,812 A | 11/1978 | Wakefield .................... 313/500 |
| 4,744,047 A | 5/1988 | Okamoto et al. ............ 364/900 |
| 4,786,149 A | 11/1988 | Hoenig et al. |
| 4,879,466 A | 11/1989 | Kitaguchi et al. ..... 250/370.14 |
| 5,049,901 A | 9/1991 | Gelbart ........................ 346/108 |
| 5,079,544 A | 1/1992 | DeMond et al. ............. 340/701 |
| 5,082,755 A | 1/1992 | Liu ................................. 430/5 |
| 5,106,455 A | 4/1992 | Jacobsen et al. .......... 156/659.1 |
| 5,109,290 A | 4/1992 | Imai ............................. 359/54 |
| 5,121,983 A | 6/1992 | Lee ................................ 353/8 |
| 5,131,976 A | 7/1992 | Hoko .......................... 156/630 |
| 5,132,723 A | 7/1992 | Gelbart ........................ 355/40 |
| 5,138,368 A | 8/1992 | Kahn et al. .................... 355/53 |
| 5,208,818 A | 5/1993 | Gelbart et al. ................ 372/30 |
| 5,269,882 A | 12/1993 | Jacobsen .................. 156/659.1 |
| 5,281,996 A | 1/1994 | Bruning et al. ................ 355/77 |
| 5,300,966 A | 4/1994 | Uehira et al. .................. 353/30 |
| 5,361,272 A | 11/1994 | Gorelik ......................... 372/50 |
| 5,416,729 A | 5/1995 | Leon et al. ................... 364/578 |
| 5,431,127 A | 7/1995 | Stevens et al. ............... 117/75 |
| 5,461,455 A | 10/1995 | Coteus et al. ................. 355/43 |
| 5,691,451 A | 11/1997 | Ceglio et al. ............ 250/492.1 |
| 5,793,473 A | 8/1998 | Koyama et al. ............... 355/55 |
| 5,818,498 A | 10/1998 | Richardson et al. ........ 347/237 |
| 5,835,458 A | * 11/1998 | Bischel et al. ............ 369/44.12 |
| 5,850,310 A | 12/1998 | Schweizer |
| 5,870,176 A | 2/1999 | Sweatt et al. ................. 355/53 |
| 5,892,231 A | 4/1999 | Baylor et al. ............... 250/398 |

(List continued on next page.)

FOREIGN PATENT DOCUMENTS

| EP | 0552953 | 7/1993 | ............. G03F/7/20 |
|---|---|---|---|
| WO | 9110170 | 11/1991 | ............. G03F/9/00 |

OTHER PUBLICATIONS

"New Multi–EB Direct Write Concept for Maskless High Throughput", Canon SubMicron Focus, vol. 5, Summer 2000.

(List continued on next page.)

*Primary Examiner*—Matthew Smith
*Assistant Examiner*—Thuan Do
(74) *Attorney, Agent, or Firm*—Haynes & Boone, LLP

(57) ABSTRACT

A digital photolithography system is provided that is capable of making smooth diagonal components. The system includes a computer for providing a first digital pattern to a digital pixel panel, such as a deformable mirror device (DMD). The DMD is capable of providing a first plurality of pixel elements for exposure onto a plurality of wafer sites. After exposure, the wafer can be scanned a distance less than the site length. The DMD then receives a second digital pattern for exposing a second plurality of pixel elements onto the plurality of sites of the subject. The exposed second plurality of pixel elements overlaps the exposed first plurality of pixel elements. This overlapping allows incremental changes to be made in the image being exposed, thereby accommodating the creation of diagonal components.

13 Claims, 10 Drawing Sheets

U.S. PATENT DOCUMENTS

| | | | |
|---|---|---|---|
| 5,900,637 A | 5/1999 | Smith | 250/492.22 |
| 5,905,545 A | 5/1999 | Poradish et al. | 348/743 |
| 5,909,658 A | 6/1999 | Clarke et al. | 702/126 |
| 5,910,940 A * | 6/1999 | Guerra | 369/116 |
| 5,949,557 A | 9/1999 | Powell | 359/8 |
| 5,955,776 A | 9/1999 | Ishikawa | 257/618 |
| 5,995,129 A | 11/1999 | Sunagawa et al. | 347/239 |
| 5,995,475 A | 11/1999 | Gelbart | 369/112 |
| 5,998,069 A | 12/1999 | Cutter et al. | 430/5 |
| 6,014,203 A | 1/2000 | Ohkawa | 355/68 |
| 6,048,011 A | 4/2000 | Fruhling et al. | 294/64.3 |
| 6,052,517 A | 4/2000 | Matsunaga et al. | 395/500.09 |
| 6,061,118 A | 5/2000 | Takeda | 355/47 |
| 6,071,315 A | 6/2000 | Ramamurthi et al. | 716/19 |
| 6,072,518 A | 6/2000 | Gelbart | 347/239 |
| 6,084,656 A | 7/2000 | Choi et al. | 355/71 |
| 6,107,011 A | 8/2000 | Gelbart | 430/397 |
| 6,124,876 A | 9/2000 | Sunagawa | 347/239 |
| 6,133,986 A | 10/2000 | Johnson | 355/67 |
| 6,204,875 B1 * | 3/2001 | De Loor et al. | 347/239 |
| 6,205,364 B1 | 3/2001 | Lichtenstein et al. | 700/58 |
| 6,238,852 B1 | 5/2001 | Klosner | |
| 6,251,550 B1 | 6/2001 | Ishikawa | 430/22 |
| 6,252,717 B1 | 6/2001 | Grosskopf | |

OTHER PUBLICATIONS

Sandstrom and Odselius, "Large–Area High Quality Photomasks", Micronic Laser Systems, published by SPIE, vol. 2621, 1985, pp. 312–318.

Sing–Gasson, Sangeet et al., Maskless Fabrication of Light-Directed Oligonucleotide Microarrays Using a Digital Micromirror Array, vol. 17, No. 10, Oct. 1999, pp. 974–978.

Devitt, Terry, "Advanced May Put Gene Chip Technology on Scientists Desktops", http://www.biotech.wise.edu/Education/biotechnews/GeneChip.html, Oct. 7, 1999.

* cited by examiner

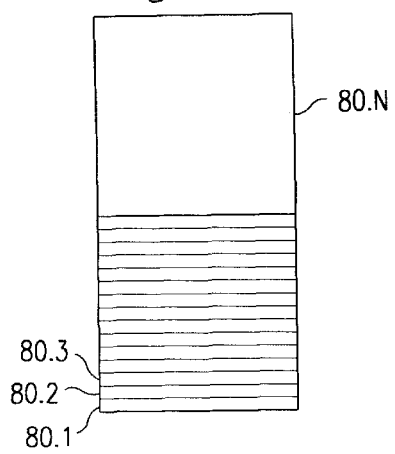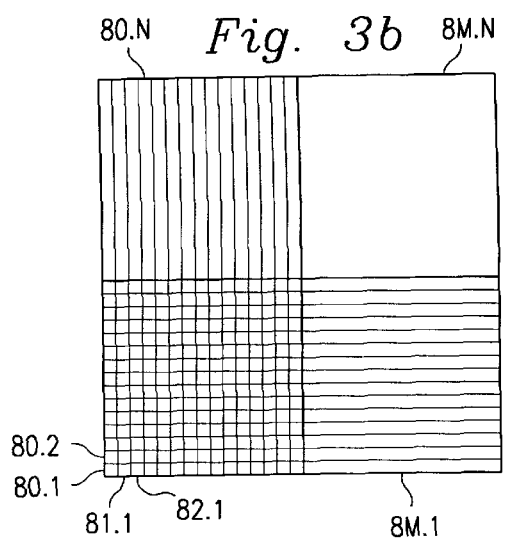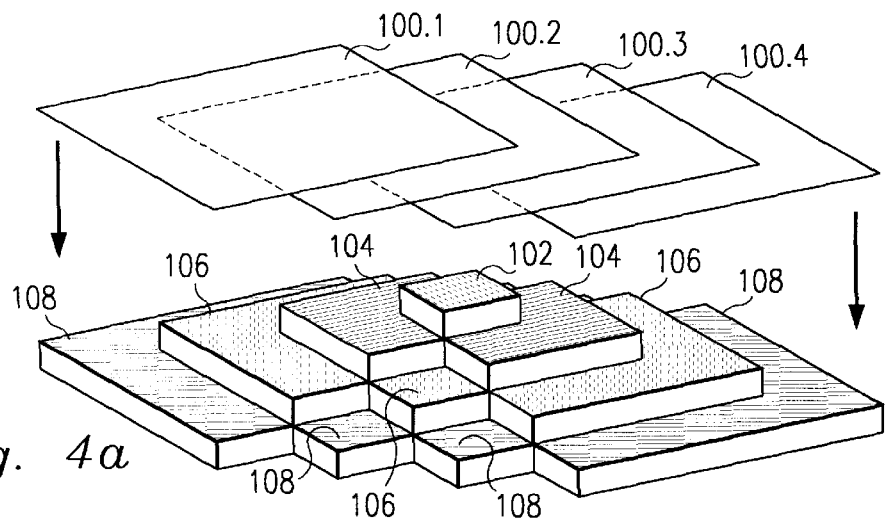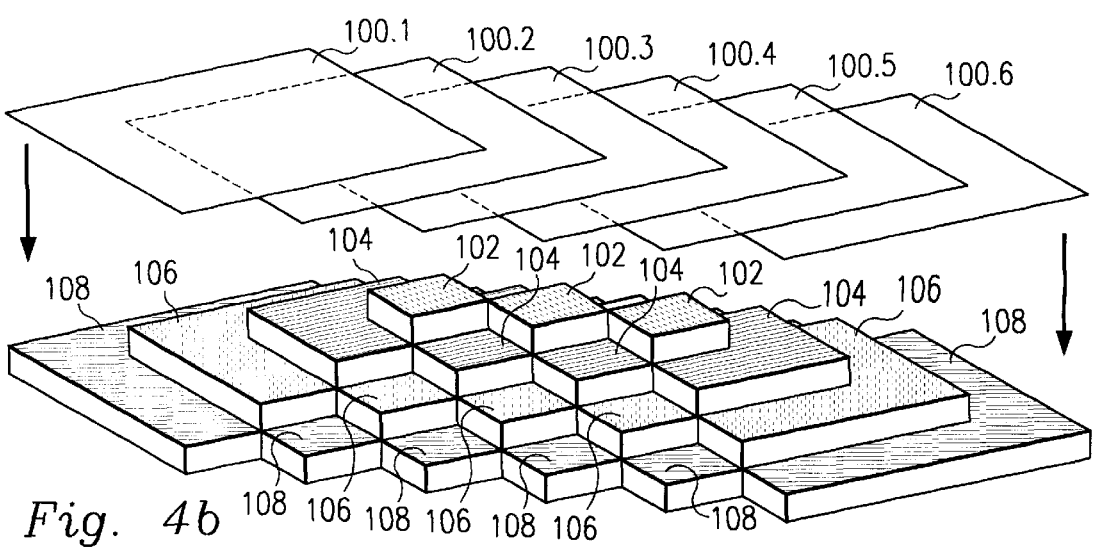

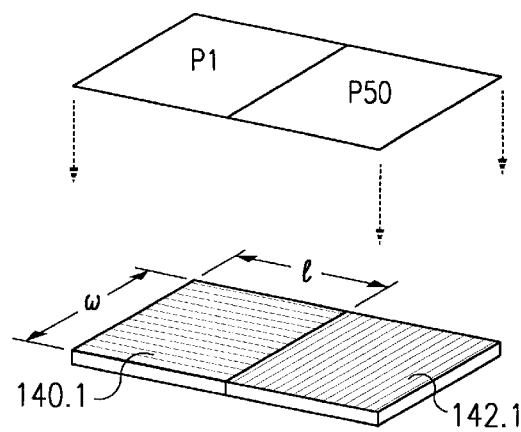
Fig. 10.1
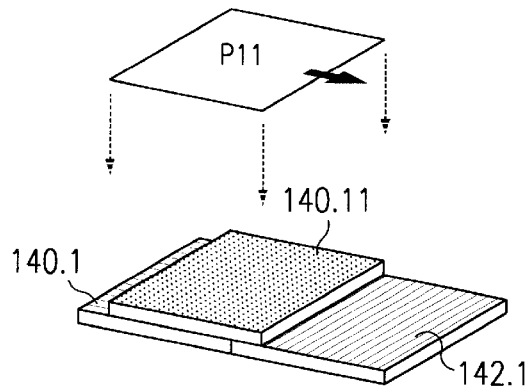
Fig. 10.2
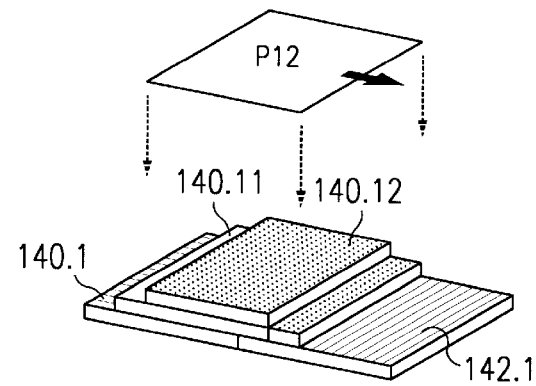
Fig. 10.3
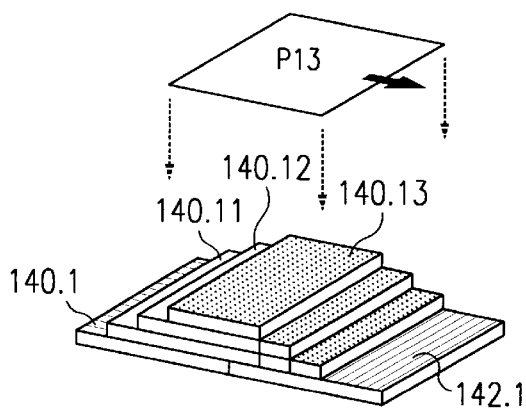
Fig. 10.4
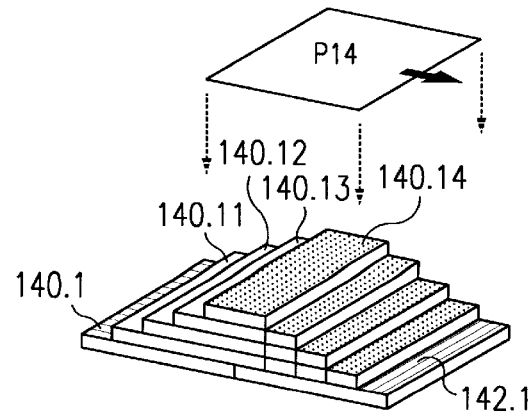
Fig. 10.5

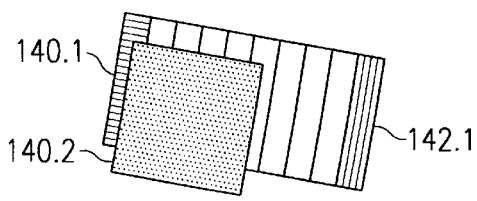
Fig. 10.6
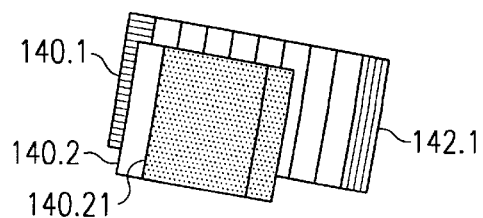
Fig. 10.7
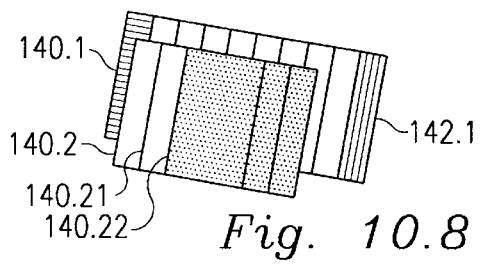
Fig. 10.8
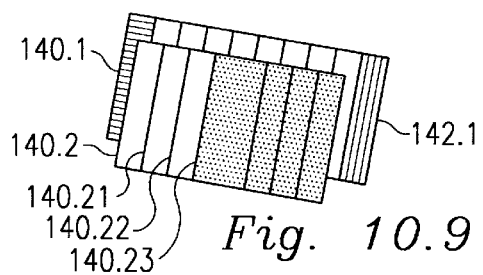
Fig. 10.9
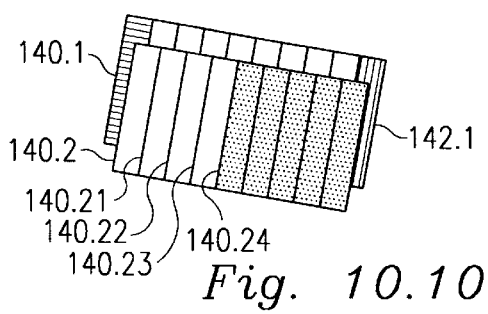
Fig. 10.10
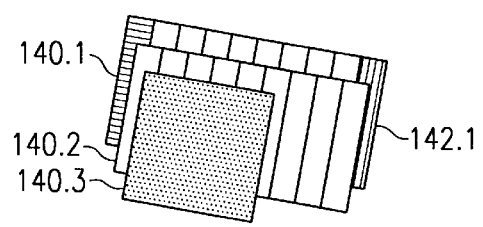
Fig. 10.11
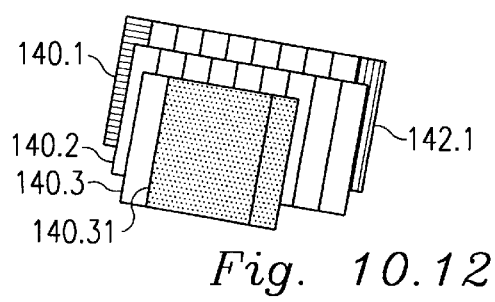
Fig. 10.12
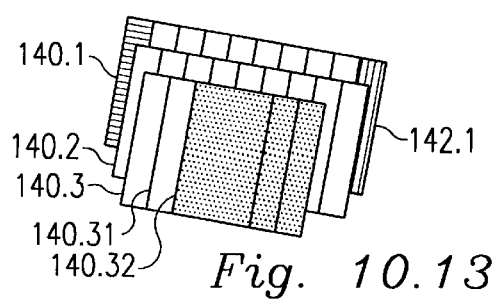
Fig. 10.13

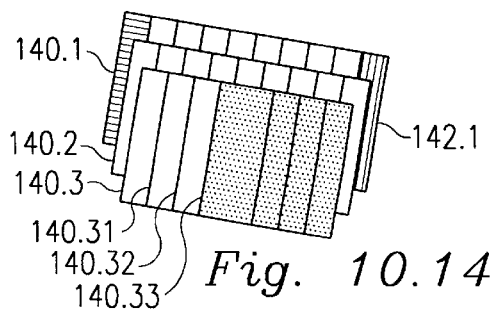
Fig. 10.14
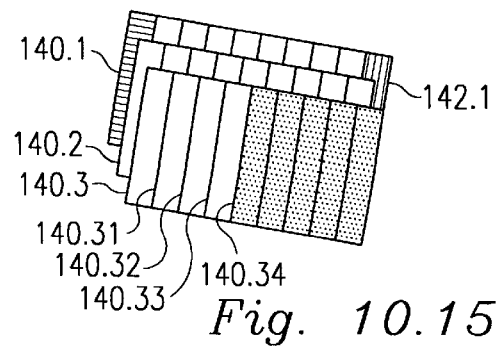
Fig. 10.15
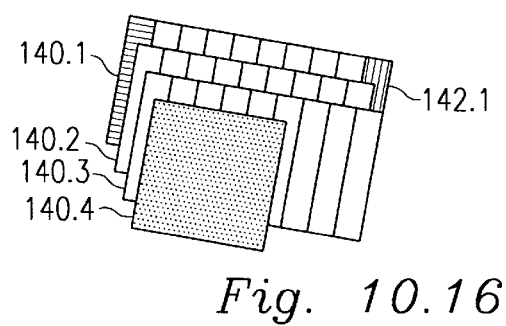
Fig. 10.16
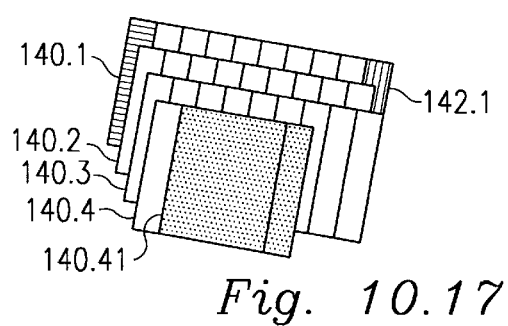
Fig. 10.17
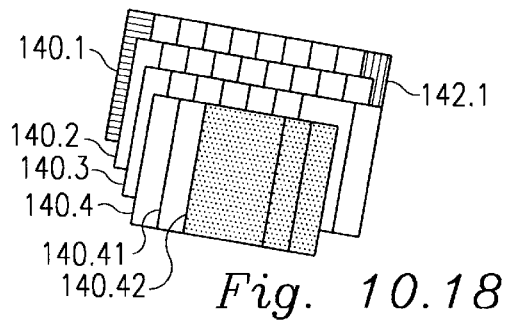
Fig. 10.18
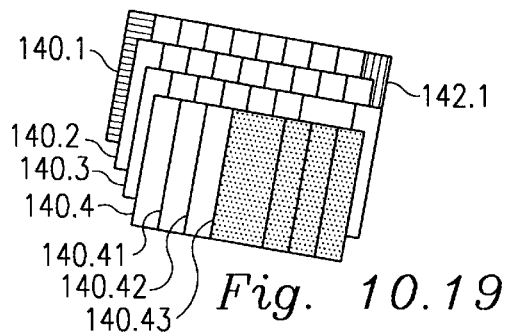
Fig. 10.19
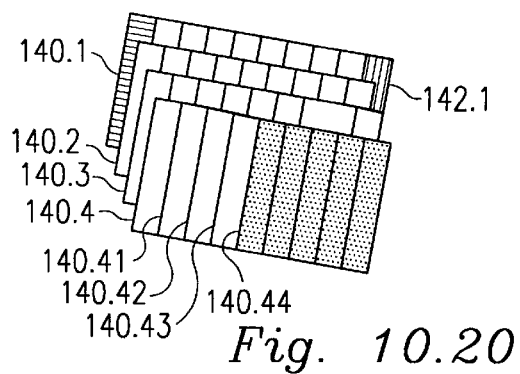
Fig. 10.20

DIGITAL PHOTOLITHOGRAPHY SYSTEM FOR MAKING SMOOTH DIAGONAL COMPONENTS

CROSS REFERENCE

This patent is a continuation of U.S. patent Ser. No. 09/633,978 filed Aug. 8, 2000.

BACKGROUND

The present invention relates generally to lithographic exposure equipment, and more particularly, to a photolithography system and method, such as can be used in the manufacture of semiconductor integrated circuit devices.

In conventional analog photolithography systems, the photographic equipment requires a mask for printing an image onto a subject. The subject may include, for example, a photo resist coated semiconductor substrate for manufacture of integrated circuits, metal substrate for etched lead frame manufacture, conductive plate for printed circuit board manufacture, or the like. A patterned mask or photomask may include, for example, a plurality of lines or structures. During a photolithographic exposure, the subject must be aligned to the mask very accurately using some form of mechanical control and sophisticated alignment mechanism.

U.S. Pat. No. 5,691,541, which is hereby incorporated by reference, describes a digital, reticle-free photolithography system. The digital system employs a pulsed or strobed excimer laser to reflect light off a programmable digital mirror device (DMD) for projecting a component image (e.g., a metal line) onto a substrate. The substrate is mounted on a stage that is moves during the sequence of pulses.

U.S. patent Ser. No. 09/480,796, filed Jan. 10, 2000 and hereby incorporated by reference, discloses another digital photolithography system which projects a moving digital pixel pattern onto specific sites of a subject. A "site" may represent a predefined area of the subject that is scanned by the photolithography system with a single pixel element.

Both digital photolithography systems project a pixel-mask pattern onto a subject such as a wafer, printed circuit board, or other medium. The systems provide a series of patterns to a pixel panel, such as a deformable mirror device or a liquid crystal display. The pixel panel provides images consisting of a plurality of pixel elements, corresponding to the provided pattern, that may be projected onto the subject.

Each of the plurality of pixel elements is then simultaneously focused to different sites of the subject. The subject and pixel elements are then moved and the next image is provided responsive to the movement and responsive to the pixel-mask pattern. As a result, light can be projected onto or through the pixel panel to expose the plurality of pixel elements on the subject, and the pixel elements can be moved and altered, according to the pixel-mask pattern, to create contiguous images on the subject.

With reference now to FIG. 1a, a conventional analog photolithography system that uses a photomask can easily and accurately produce an image 10 on a subject 12. The image 10 can have horizontal, vertical, diagonal, and curved components (e.g., metal conductor lines) that are very smooth and of a consistent line width. Referring also to FIG. 1b, a conventional digital photolithography system that uses a digital mask can also produce an image 14 on a subject 16. Although the image 14 can have horizontal, vertical, diagonal, and curved components, like the analog image 12 of FIG. 1a, some of the components (e.g., the diagonal ones) are neither very smooth nor of a consistent line width.

Certain improvements are desired for digital photolithograph systems, such as the ones described above. For one, it is desirable to provide smooth components, such as diagonal and curved metal lines, like those produced with analog photolithography systems. In addition, it is desired to have a relatively large exposure area, to provide good image resolution, to provide good redundancy, to use a relatively inexpensive incoherent light source, to provide high light energy efficiency, to provide high productivity and resolution, and to be more flexible and reliable.

SUMMARY

A technical advance is provided by a novel method and system for making smooth diagonal components with a digital photolithography system. In one embodiment, the method for performing digital lithography exposes a first pixel element onto a first site of a subject such as a resist coated wafer. The method then repositions the wafer for a distance and exposes a second pixel element. The exposure from the second pixel element "overlays," or "overlaps" a portion, but not all, of the exposure from the first pixel element. This process can be repeated until a majority of the wafers surface is exposed.

In some embodiments, the method repositions the subject in a different direction and exposes a third pixel element onto the subject. The exposed third pixel element overlays a portion, but not all, of the exposure from the first pixel element and/or the second pixel element.

In some embodiments, the first distance is less than half the length of the first site. After exposing the second pixel element, the system can scan again and expose a third pixel element. The exposure from the third pixel element overlays a portion, but not all, of the exposure from both the first pixel element and the second pixel element.

A system is also provided for making smooth diagonal components. The system includes means, such as a computer, for providing a first digital pattern to a digital pixel panel, such as a deformable mirror device (DMD). The DMD is capable of providing a first plurality of pixel elements for exposure onto a plurality of sites of the subject, each of the sites having a length in one direction and a width in another direction.

After exposure, the subject can be repositioned in the one direction, relative to the digital pixel panel. The DMD is then capable of providing a second digital pattern for exposing the second plurality of pixel elements onto the plurality of sites of the subject. The exposed second plurality of pixel elements overlays the exposure from the first plurality of pixel elements.

An advantage of the present invention is that very smooth and consistent diagonal components (and other shaped components) can be produced with digital lithography.

Another advantage of the present invention is that a high image resolution is maintained.

Yet another advantage of the present invention is that it can provide good redundancy.

Still another advantage of the present invention is that it maintains the same data capacity as conventional digital photolithography systems.

BRIEF DESCRIPTION OF THE DRAWINGS

FIGS. 3a and 3b illustrate various overlay arrangement of pixels being exposed on a subject.

FIGS. 4a and 4b illustrate the effect of overlaid pixels on the subject.

FIG. 5 illustrates a component exposure from the system of FIG. 2, compared to conventional exposures from the systems of FIGS. 1b and 1a.

FIGS. 8, 9, and 10.1–10.20 provide diagrams of a subject that is positioned and scanned at an angle on a stage. The angle facilitates the overlapping exposure of a site on the subject according to one embodiment of the present invention.

DETAILED DESCRIPTION

The present disclosure relates to exposure systems, such as can be used in semiconductor photolithographic processing. It is understood, however, that the following disclosure provides many different embodiments, or examples, for implementing different features of the invention. Specific examples of components and arrangements are described below to simplify the present disclosure. These are, of course, merely examples and are not intended to limit the invention from that described in the claims.

Maskless Photolithography System

Figure 1A:
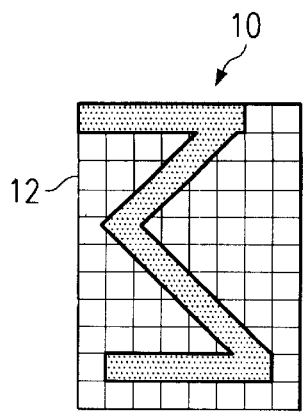
FIGS. 1a and 1b are images produced by a conventional analog photolithography system and a conventional digital photolithography system, respectively.
Figure 1B:
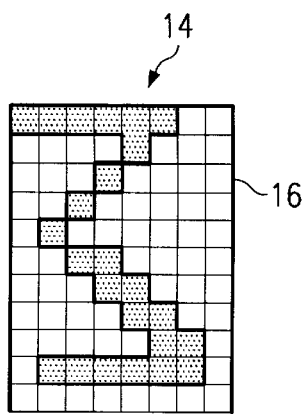
Figure 2:
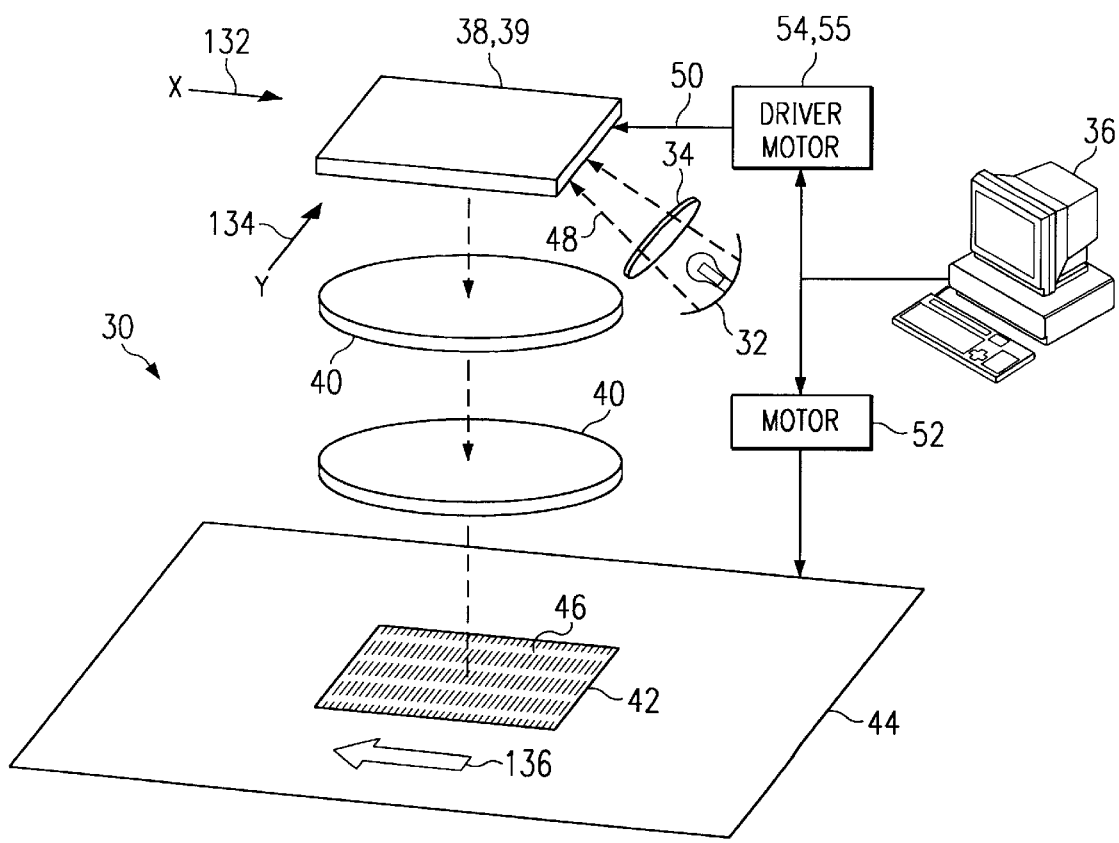
FIG. 2 is a block diagram of an improved digital photolithography system for implementing various embodiments of the present invention.

Referring now to FIG. 2, a maskless photolithography system 30 includes a light source 32, a first lens system 34, a computer aided pattern design system 36, a pixel panel 38, a panel alignment stage 39, a second lens system 40, a subject 42, and a subject stage 44. A resist layer or coating 46 may be disposed on the subject 42. The light source 32 may be an incoherent light source (e.g., a Mercury lamp) that provides a collimated beam of light 48 which is projected through the first lens system 34 and onto the pixel panel 38.

The pixel panel 38 is provided with digital data via suitable signal line(s) 50 from the computer aided pattern design system 36 to create a desired pixel pattern (the pixel-mask pattern). The pixel-mask pattern may be available and resident at the pixel panel 38 for a desired, specific duration. Light emanating from (or through) the pixel-mask pattern of the pixel panel 38 then passes through the second lens system 40 and onto the subject 42. In this manner, the pixel-mask pattern is projected onto the resist coating 46 of the subject 42.

The computer aided mask design system 36 can be used for the creation of the digital data for the pixel-mask pattern. The computer aided pattern design system 36 may include computer aided design (CAD) software similar to that which is currently used for the creation of mask data for use in the manufacture of a conventional printed mask. Any modifications and/or changes required in the pixel-mask pattern can be made using the computer aided pattern design system 36. Therefore, any given pixel-mask pattern can be changed, as needed, almost instantly with the use of an appropriate instruction from the computer aided pattern design system 36. The computer aided mask design system 36 can also be used for adjusting a scale of the image or for correcting image distortion.

In the present embodiment, the pixel panel 38 is a digital light processor (DLP) or digital mirror device (DMD) such as is illustrated in U.S. Pat. No. 5,079,544 and patents referenced therein. Current DMD technology provides a 600×800 array of mirrors for a set of potential pixel elements. Each mirror can selectively direct the light 48 towards the subject 42 (the "ON" state) or away from the subject (the "OFF" state). Furthermore, each mirror can alternate between ON and OFF for specific periods of time to accommodate variations in light efficiency. For example, if the second lens system 40 has a "darker" area (e.g., a portion of the lens system is inefficient or deformed), the DMD can alternate the mirrors corresponding with the "brighter" areas of the lens, thereby equalizing the overall light energy projected through the lens. For the sake of simplicity and clarity, the pixel panel 38 will be further illustrated as one DMD. Alternate embodiments may use multiple DMDs, one or more liquid crystal displays and/or other types of digital panels.

In some embodiments, the computer aided mask design system 36 is connected to a first motor 52 for moving the stage 44, and a driver 54 for providing digital data to the pixel panel 38. In some embodiments, an additional motor 55 may be included for moving the pixel panel, as discussed below. The system 36 can thereby control the data provided to the pixel panel 38 in conjunction with the relative movement between the pixel panel 38 and the subject 42.

Pixel Overlay

The amount of exposure time, or exposure intensity, of light from the pixel panel 38 directly affects the resist coating 46. For example, if a single pixel from the pixel panel 38 is exposed for a maximum amount of time onto a single site of the subject 42, or for a maximum intensity, then the corresponding portion of resist coating 46 on the subject would have a maximum thickness (after non-exposed or under exposed resist has been removed). If the single pixel from the pixel panel 38 is exposed for less than the maximum amount of time, or at a reduced intensity, the corresponding portion of resist coating 46 on the subject 42 would have a moderate thickness. If the single pixel from the pixel panel 38 is not exposed, then the corresponding portion of resist coating 42 on the subject 42 would eventually be removed.

Referring now to FIGS. 3a and 3b, it is desired that each pixel element exposed onto a site overlap previous pixel element exposures. FIG. 3a shows a one-direction overlay scenario where a pixel element 80.1 is overlapped by pixel element 80.2, which is overlapped by pixel element 80.3, . . . which is overlapped by pixel element 80.N, where "N" is the total number of overlapped pixel elements in a single direction. It is noted that, in the present example, pixel element 80.1 does not overlay pixel element 80.N.

FIG. 3b is a two-dimensional expansion FIG. 3a. In this example, pixel element 80.1 is overlapped in another direction by pixel element 81.1, which is overlapped by pixel element 82.1 . . . which is overlapped by pixel element 8M.N, where "M" is the total number of overlapped pixel elements in a second direction. As a result, a total of M×N pixel elements can be exposed for a single site.

Referring now to FIG. 4a, consider for example a site that has the potential to be exposed by (M,N)=(4,4) pixel elements. In this example, only four of the 16 possible pixel elements are actually "ON", and therefore expose portions of the subject 42. These four pixel elements are designated: 100.1, 100.2, 100.3, 100.4. The four pixel elements 100.1–100.4 are exposed onto the photo resist 46 of the subject 42. All four pixel elements 100.1–100.4 overlap with each other at an area 102; three of the pixel elements overlap at an area 104; two of the pixel elements overlap at an area 106; and an area 108 is only exposed by one pixel element. Accordingly, area 102 will receive maximum exposure (100%); area 104 will receive 75% exposure; area 106 will receive 50% exposure; and area 108 will receive 25% exposure. It is noted that the area 102 is very small, 1/16th the size of any pixel element 100.1–100.4 in the present example.

Referring now to FIG. 4b, the example of FIG. 4a can be expanded to (M,N)=(6,6) pixel elements, with two more overlapping pixel elements 100.5, 100.6 in the ON state. The pixel elements 100.5, 100.6 are therefore exposed onto the photo resist 46 of the subject 42 so that they overlap some of the four pixel elements 100.1–100.4. In this expanded example, the pixel elements 100.1–100.4 overlap with each other at area 102; the four pixel elements 100.2–100.5 overlap each other at an area 110; and the four pixel elements 100.3–100.6 overlap each other at an area 112. In addition, area 114 will receive 75% exposure; area 116 will receive 50% exposure; and area 118 will receive 25% exposure. As a result, a very small ridge is formed on the photo resist 46.

In one embodiment, the pixel panel 32 of the present invention may have a 600×800 array of pixel elements. The overlapping is defined by the two variables: (M, N). Considering one row of 600 pixels, the system overlaps the 600 pixels onto an overlay area 184 of:

$$(M,N)=20 \text{ pixels} \times 30 \text{ pixels}. \tag{1}$$

Figure 5:
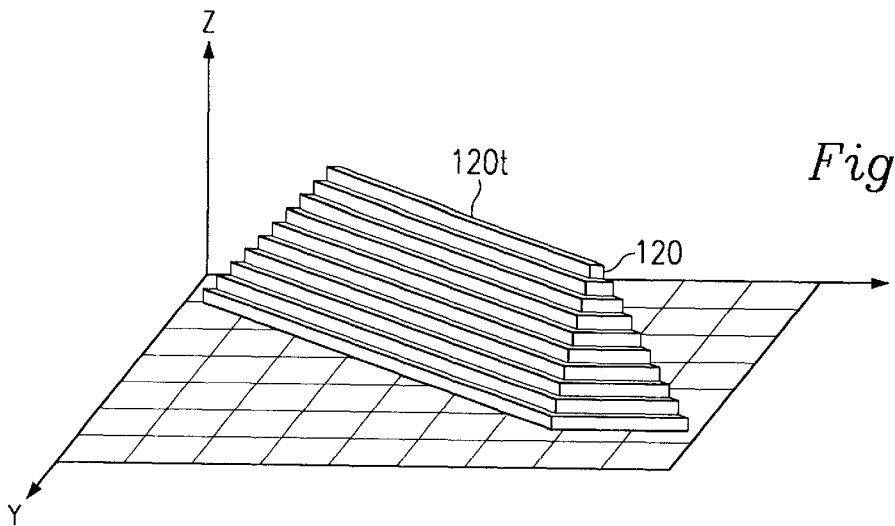
Figure 6A:
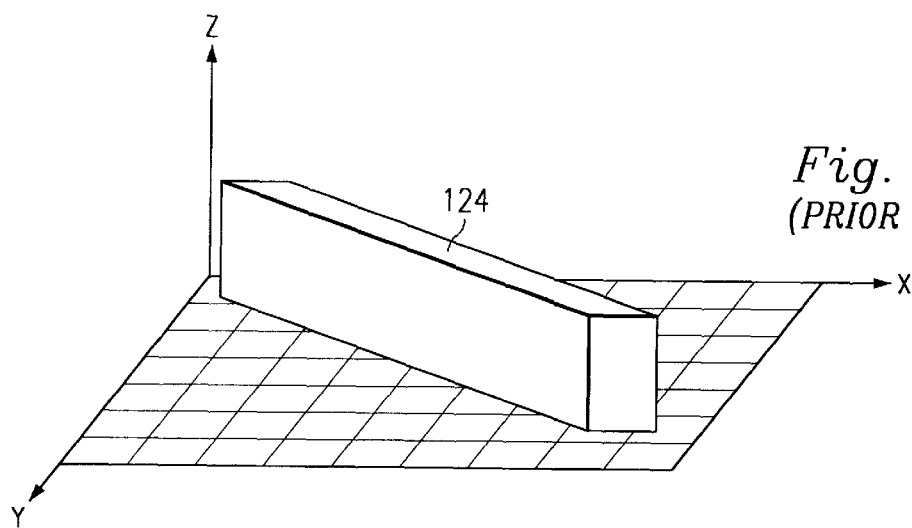
FIGS. 6a and 6b illustrate component exposures, corresponding to the images of FIGS. 1a and 1b, respectively.
Figure 6B:
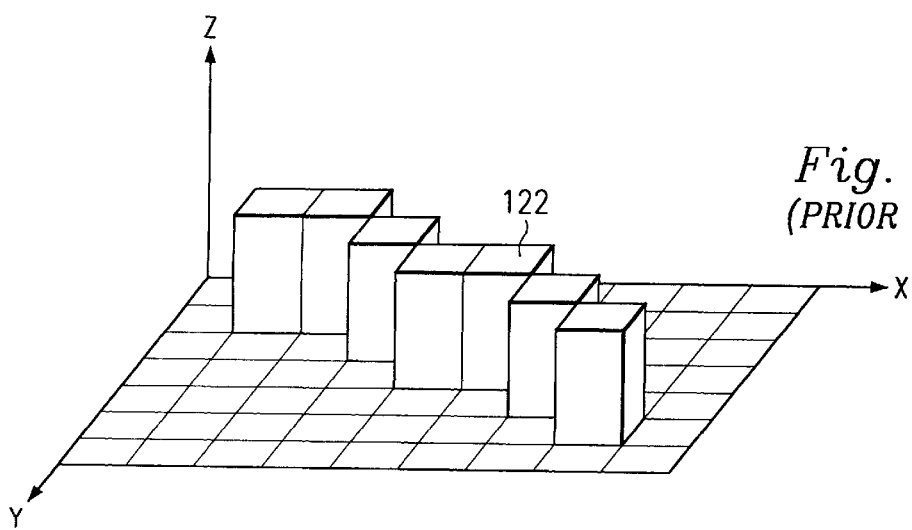

Referring also to FIG. 5a, the process of FIGS. 4a and 4b can be repeated to produce a diagonal component 150 on the subject 42. Although the example of FIGS. 4a and 4b have only four potential degrees of exposure (100%, 75%, 50%, 25%), by increasing the number of overlaps (such as is illustrate in FIG. 3b), it is possible to have a very fine resolution of desired exposure.

The diagonal component 120 appears as a prism-shaped structure having a triangular cross-section. If the subject 42 is a wafer, the component 120 may be a conductor (e.g., a metal line), a section of poly, or any other structure. The topmost portion 120t of the component is the portion of photo resist 46 that is overlapped the most by corresponding pixel elements, and therefore received the maximum exposure.

The component 120 is contrasted with a component 122 of FIG. 5b and a component 124 of FIG. 5c. The component 122 of FIG. 5b illustrates a conventional digital component. The component 124 of FIG. 5c illustrates a conventional analog component.

Overlay Methods

Referring again to FIG. 2, the above-described overlays can be implemented by various methods. In general, various combinations of moving and/or arranging the pixel panel 38 and/or the subject 42 can achieve the desired overlap.

In one embodiment, the maskless photolithography system 30 performs two-dimensional digital scanning by rapidly moving the image relative to the subject in two directions (in addition to the scanning motion). The panel motor 55 is attached to the pixel panel 38 to move the pixel panel in two directions, represented by an x-arrow 132 and a y-arrow 134. The panel motor 55 may be a piezo electric device (PZT) capable of making very small and precise movements.

In addition, the scanning motor 55 scans the stage 44, and hence the subject 42, in a direction 136. Alternatively, the stage 44 can be fixed and the panel motor 55 can scan the pixel panel 38 (and the lenses 40) opposite to direction 136.

Figure 7:
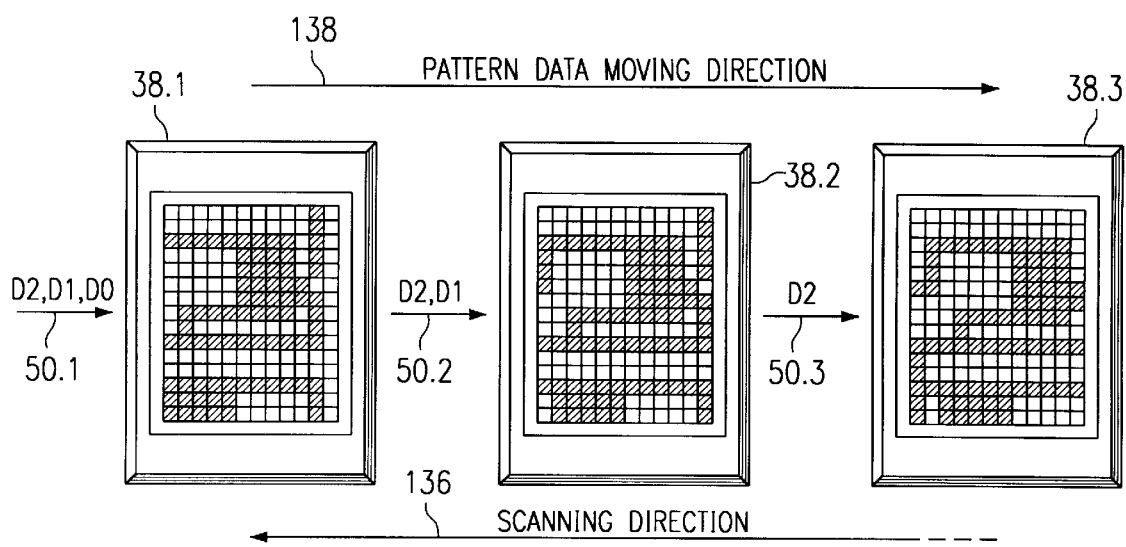
FIG. 7 illustrates various pixel patterns being provided to a pixel panel of the system of FIG. 2.

Referring also to FIG. 7, corresponding to the image scanning described above, the pixel-mask pattern being projected by the pixel panel 38 changes accordingly. This correspondence can be provided, in one embodiment, by having the computer system 36 (FIG. 2) control both the scanning movement 70 and the data provided to the pixel panel 38. The illustrations of FIG. 7 and the following discussions describe how the data can be timely provided to the pixel panel.

FIG. 7 shows three intermediate patterns of pixel panel 38. Since the pattern on the pixel panel 38 and the data on the signal lines 50 change over time, the corresponding patterns on the pixel panel and data on the signal lines at a specific point in time are designated with a suffix "0.1", "0.2", or "0.3". In the first intermediate pattern, the pattern of pixel panel 38.1 is created responsive to receiving data D0 provided through the signal lines 50.1. In the present example, the pattern is created as a matrix of pixel elements in the pixel panel 38.1. After a predetermined period of time (e.g., due to exposure considerations being met), the pattern is shifted. The shifted pattern (now shown as pixel panel 38.2) includes additional data D1 provided through the signal lines 38.2. The shifting between patterns may also utilize a strobing or shuttering of the light source 32.

In the second intermediate pattern of FIG. 7, D1 represents the left-most column of pixel elements in the pattern of DMD 38.2. After another predetermined period of time, the pattern (now shown as pixel panel 38.3) is shifted again. The twice-shifted pattern includes additional data D2 provided through the signal lines 38.2. In the third intermediate pattern of FIG. 7, D2 now represents the left-most column of pixel elements in the pattern of the DMD 38.3. Thus, the pattern moves across the pixel panel 38 in a direction 138. It is noted that the pattern direction 138, as it is being provided to the pixel panel 38 from the signal lines 50, is moving opposite to the scanning direction 136. In some embodiments, the pattern may be shifted in additional directions, such as perpendicular to the scanning direction 136.

Figure 8:
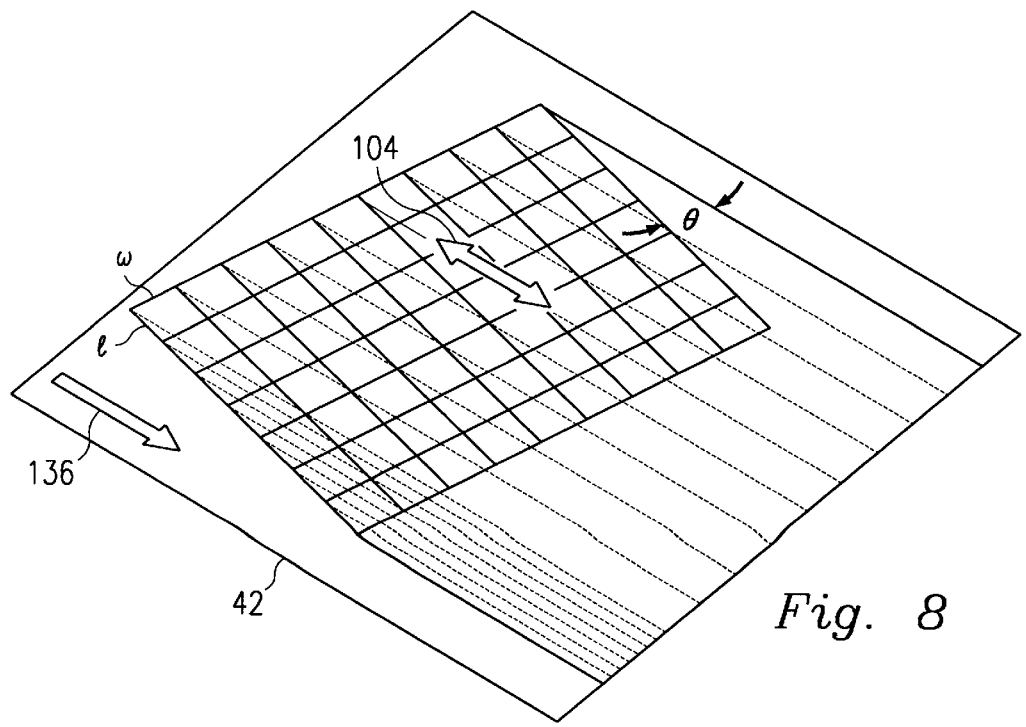

Referring now to FIG. 8, in some embodiments, the maskless photolithography system 30 performs two-dimensional digital scanning by rapidly moving the image relative to the subject 42 in one direction (in addition to the scanning motion) while the subject is positioned on the stage 44 to accommodate the other direction. The panel motor 55 moves the pixel panel 38 in one direction, represented by the y-arrow 134. The scanning motor 55 scans the stage 44, and hence the subject 42 in a direction 136. Alternatively, the stage 44 can be fixed and the panel motor 55 can scan the pixel panel 38 (and the lenses 40) opposite to direction 136.

The image from the pixel panel 38 and/or the subject 42 is aligned at an angle $\theta$ with the scan direction 136. Considering that each pixel projected onto subject 42 has a length of $l$ and a width of $w$, then $\theta$ can be determined as:

$$\theta = \tan^{-1}(w-1/M/N \times l) \tag{2}$$

In another embodiment, the offset may go in the opposite direction, so that $\theta$ can be determined as:

$$\theta = \tan^{-1}(w+1/M/N \times l) \tag{3}$$

Figure 9:
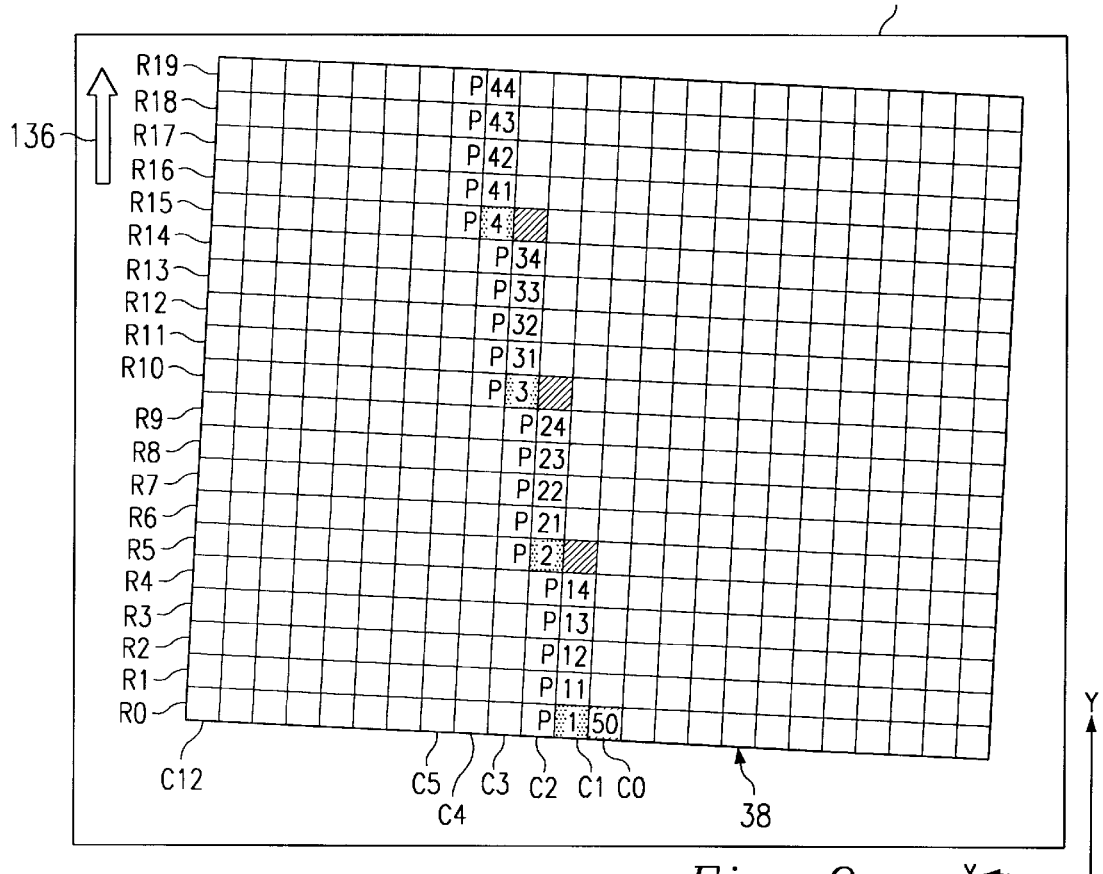

Referring to FIGS. 9 and 10.1, consider for example two sites 140.1, 142.1 on the subject 42. Initially, the two sites 140.1 and 142.1 are simultaneously exposed by pixel elements P1 and P50, respectively, of the pixel panel 38. The pixel elements P1 and P50 are located at a row R0 and columns C1 and C0, respectively, of the pixel panel 38. This row and column designation is arbitrary, and has been identified in the present embodiment to clarify the example. The following discussion will focus primarily on site 140.1. It is understood, however, that the methods discussed herein are typically applied to multiple sites of the subject, including the site 142.1, but further illustrations and discussions with respect to site 142.1 will be avoided for the sake of clarity.

As can be clearly seen in FIG. 9, the pixel panel 38 is angled with respect to the subject 42 and the scan direction 136. As the system 30 scans, pixel element P11 would normally be projected directly on top of site 140.1. However, as shown in FIG. 10.2, the pixel element P11 exposes at a location 140.11 that is slightly offset in the y direction (or −y direction) from the site 140.1. As the system 30 continues to scan, pixel elements P12–P14 are exposed on offset locations 140.12–140.14, respectively, shown in FIGS. 10.3–10.5, respectively. Pixel elements P11–P14 are on adjacent consecutive rows R1, R2, R3, R4 of column C1 of the pixel panel 38.

In the present embodiment, the scanning motor 52 moves the stage 44 (and hence the subject 42) a distance of l, the length of the pixel site 140.1, for each projection. To provide the offset discussed above, the panel motor 55 moves the pixel panel 38 an additional distance of l/(N−1) for each projection. (N=5 in the present example). Therefore, a total relative movement SCAN STEP for each projection is:

$$\text{SCAN STEP} = l + l/(N-1). \tag{4}$$

In another embodiment, the offset may go in the opposite direction, so that the total relative movement SCAN STEP for each projection is:

$$\text{SCAN STEP} = l - l/(N-1). \tag{5}$$

In some embodiments, the panel motor 55 is not needed. Instead, the scanning motor 52 moves the stage the appropriate length (equation 4 or 5, above).

Once N locations have been exposed, the next pixel elements being projected onto the desired locations are of an adjacent column. With reference to FIG. 10.6, in the present example, a pixel element P2 at row R5, column C2 exposes a location 140.2 that is slightly offset in the x direction (or −x direction, depending on whether equation 4 or 5 is used) from the site 140.1. As the system 30 continues to scan, pixel elements P21–P24 are exposed on offset locations 140.21–140.24, respectively, shown in FIGS. 10.7–10.10, respectively. Pixel elements P21–P24 are on adjacent consecutive rows R6, R7, R8, R9 of column C2 of the pixel panel 38.

Once N more pixel locations have been exposed, the next pixel elements being projected onto the desired locations are of yet another adjacent column. With reference to FIG. 10.11, in the present example, a pixel element P3 at row R10, column C3 exposes a location 140.3 that is slightly offset in the x direction (or −x direction, depending on whether equation 4 or 5 is used) from the location 140.2. As the system 30 continues to scan, pixel elements P31–P34 are exposed on offset locations 140.31–140.34, respectively, shown in FIGS. 10.12–10.15, respectively. Pixel elements P31–P34 are on adjacent consecutive rows R11, R12, R13, R14 of column C3 of the pixel panel 38.

The above process repeats to fully scan the desired overlapped image. With reference to FIG. 10.16, in the present example, a pixel element P4 at row R15, column C4 exposes a location 140.4 that is slightly offset in the x direction (or −x direction, depending on whether equation 4 or 5 is used) from the location 140.3. As the system 30 continues to scan, pixel elements P41–P44 are exposed on offset locations 140.41–140.44, respectively, shown in FIGS. 10.17–10.20, respectively. Pixel elements P41–P44 are on adjacent consecutive rows R16, R17, R18, R19 of column C4 of the pixel panel 38.

Point Array System and Method

Figure 11:
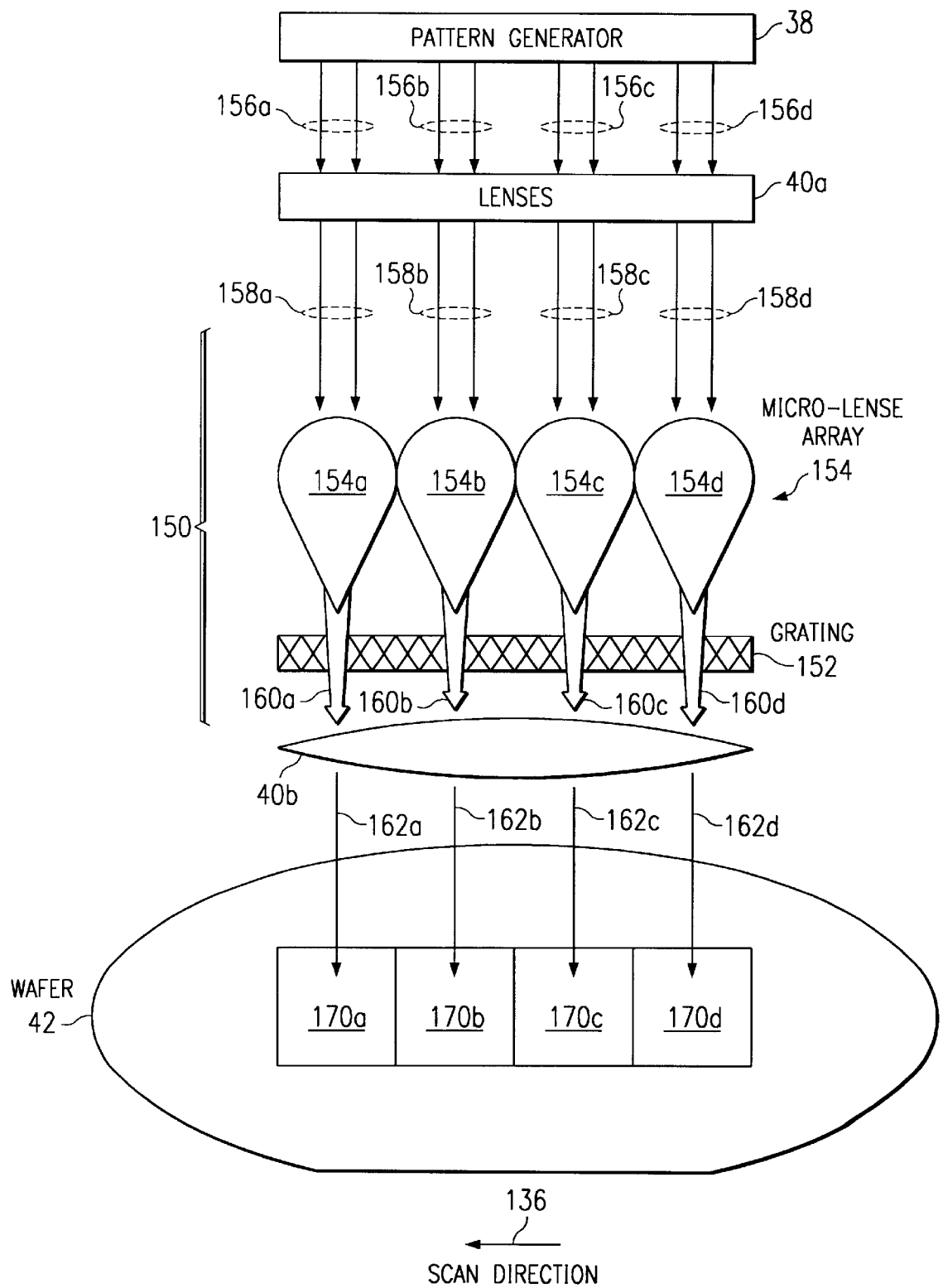
FIG. 11 is a block diagram of a portion of the digital photolithography system of FIG. 2 for implementing additional embodiments of the present invention FIGS. 12–13 provide diagrams of a subject that is positioned and scanned at an angle on a stage and being exposed by the system of FIG. 11.

Referring now to FIG. 11, in another embodiment of the present invention, the photolithography system 30 utilizes a unique optic system 150 in addition to the lens system 40. The optic system 150 is discussed in detail in U.S. patent Ser. No. 09/480,796, which is hereby incorporated by reference. It is understood that the lens system 40 is adaptable to various components and requirements of the photolithography system 30, and one of ordinary skill in the art can select and position lenses appropriately. For the sake of example, a group of lenses 40a and an additional lens 40b are configured with the optic system 150.

The optic system 150 includes a grating 152 and a point array 154. The grating 152 may be a conventional shadow mask device that is used to eliminate and/or reduce certain bandwidths of light and/or diffractions between individual pixels of the pixel panel 38. The grating 152 may take on various forms, and in some embodiments, may be replaced with another device or not used at all.

The point array 154 is a multi-focus device. There are many types of point arrays, including a Fresnel ring, a magnetic e-beam lens, an x-ray controlled lens, and an ultrasonic controlled light condensation device for a solid transparent material.

In the present embodiment, the point array 154 is a compilation of individual microlenses, or microlens array. In the present embodiments, there are as many individual microlenses as there are pixel elements in the pixel panel 38. For example, if the pixel panel 38 is a DMD with 600×800 pixels, then the microlens array 154 may have 600×800 microlenses. In other embodiments, the number of lenses may be different from the number of pixel elements in the pixel panel 38. In these embodiments, a single microlens may accommodate multiple pixels elements of the DMD, or the pixel elements can be modified to account for alignment. For the sake of simplicity, only one row of four individual lenses 154a, 154b, 154c, 154d will be illustrated. In the present embodiment, each of the individual lenses 154a, 154b, 154c, 154d is in the shape of a rain drop. This shape provides specific diffraction benefits that will be discussed below. It is understood, however, that shapes other than those illustrated may also be used.

Similar to the lens system 40 of FIG. 2, the optic system 150 is placed between the pixel panel 38 and the subject 42. For the sake of example, in the present embodiment, if the pixel panel 38 is a DMD device, light will (selectively) reflect from the DMD device and towards the optic system 150. If the pixel panel 38 is a LCD device, light will (selectively) flow through the LCD device and towards the optic system 150. To further exemplify the present embodiment, the pixel panel 38 includes one row of elements (either mirrors or liquid crystals) for generating four pixel elements.

In continuance with the example, four different pixel elements 156a, 156b, 156c, 156d are projected from each of the pixels of the pixel panel 38. In actuality, the pixel elements 156a, 156b, 156c, 156d are light beams that may be either ON or OFF at any particular instant (meaning the light beams exist or not, according to the pixel-mask pattern), but for the sake of discussion all the light beams are illustrated.

The pixel elements 156a, 156b, 156c, 156d pass through the lens system 40a and are manipulated as required by the current operating conditions. As discussed earlier, the use of the lens system 40a and 40b are design options that are well understood in the art, and one or both may not exist in some embodiments. The pixel elements 156a, 156b, 156c, 156d that are manipulated by the lens system 40a are designated 158a, 158b, 158c, 158d, respectively.

The pixel elements 158a, 158b, 158c, 158d then pass through the microlens array 154, with each beam being directed to a specific microlens 154a, 154b, 154c, 154d, respectively. The pixel elements 158a, 158b, 158c, 158d that are manipulated by the microlens array 154 are designated as individually focused light beams 160a, 160b, 160c, 160d, respectively. As illustrated in FIG. 11, each of the light beams 160a, 160b, 160c, 160d are being focused to focal points 162a, 162b, 162c, 162d for each pixel element. That is, each pixel element from the pixel panel 38 is manipulated until it focuses to a specific focal point. It is desired that the focal points 162a, 162b, 162c, 162d exist on the subject 42. To achieve this goal, the lens 40b may be used in some embodiments to refocus the beams 160a, 160b, 160c, 160d on the subject 42. FIG. 11 illustrates focal points 162a, 162b, 162c, 162d as singular rays, it being understood that the rays may not indeed be focused (with the possibility of intermediate focal points, not shown) until they reach the subject 42.

Continuing with the present example, the subject 42 includes four exposure sites 170a, 170b, 170c, 170d. The sites 170a, 170b, 170c, 170d are directly associated with the light beams 162a, 162b, 162c, 162d, respectively, from the microlenses 154a, 154b, 154c, 154d, respectively. Also, each of the sites 170a, 170b, 170c, 170d are exposed simultaneously. However, the entirety of each site 170a, 170b, 170c, 170d is not exposed at the same time.

Figure 12:
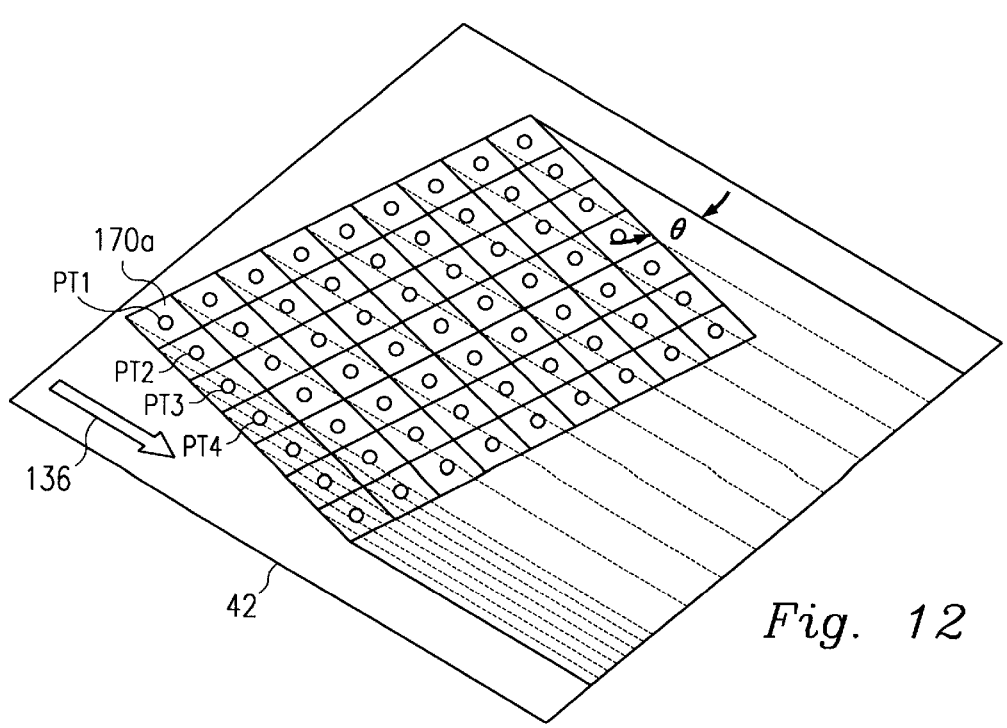

Referring now to FIG. 12, the maskless photolithography system 30 with the optic system 150 can also performs two-dimensional digital scanning, as discussed above with reference to FIG. 8. For example, the image from the pixel panel 38 may be aligned at the angle θ (equations 2 and 3, above) with the scan direction 136.

Figure 13:
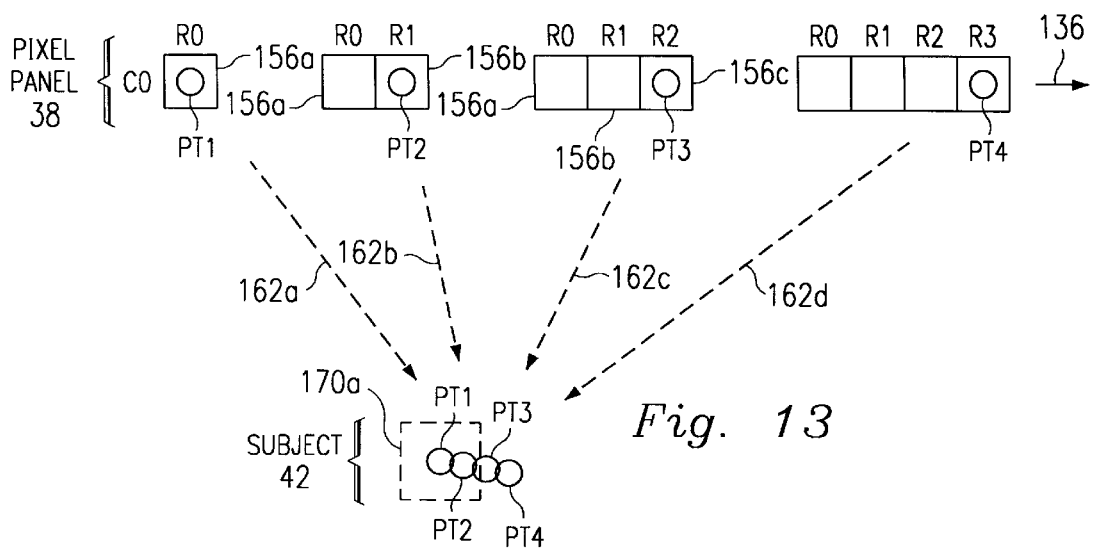

Referring also to FIG. 13, the present embodiment works very similar to the embodiments of FIGS. 9–10. However, instead of a relatively large location being exposed, the pixel elements are focused and exposed to a relatively small point (e.g., individually focused light beams 162a, 162b, 162c, 162d from FIG. 11) on the sites 170a, 170b, 170c, 170d.

First of all, the pixel element 156a exposes the individually focused light beam 162a onto the single site 170a of the subject 42. The focused light beam 162a produces an exposed (or unexposed, depending on whether the pixel element 156a is ON or OFF) focal point PT1. As the system 30 scans, pixel element 156b exposes the individually focused light beam 162b onto the site 170a. The focused light beam 162b produces an exposed (or unexposed) focal point PT2. Focal point PT2 is slightly offset from the focal point PT1 in the y direction (or -y direction). As the system 30 continues to scan, pixel elements 156c and 156d expose the individually focused light beams 162c and 162d, respectively, onto the site 170a. The focused light beams 162c and 162d produce exposed (or unexposed) focal points PT3 and PT4, respectively. Focal point PT3 is slightly offset from the focal point PT2 in the y direction (or -y direction), and focal point PT4 is similarly offset from the focal point PT3.

Once N pixel elements have been projected, the next pixels being projected onto the desired sites are of an adjacent column. This operation is similar to that shown in FIGS. 10.6–10.20. The above process repeats to fully scan the desired overlapped image on the site 170a.

It is understood that while light beam 162a is being exposed on the site 170a, light beam 162b is being exposed on the site 170b, light beam 162c is being exposed on the site 170c, and light beam 162d is being exposed on the site 170d. Once the system 30 scans one time, light beam 162a is exposed onto a new site (not shown), while light beam 162b is exposed on the site 170a, light beam 162c is exposed on the site 170b, and light beam 162d is exposed on the site 170c. This repeats so that the entire subject can be scanned (in the y direction) by the pixel panel 38.

It is further understood that in some embodiments, the substrate 42 may be moved rapidly while the light beams (e.g., 162a–d) transition from one site to the other (e.g., 170a–170d, respectively), and slowly while the light beams are exposing their corresponding sites.

By grouping several pixel panels together in the x-direction, the entire subject can be scanned by the pixel panels. The computer system 36 can keep track of all the data provided to each pixel panel to accommodate the entire scanning procedure. In other embodiments, a combination of scanning and stepping can be performed. For example, if the subject 42 is a wafer, a single die (or group of die) can be scanned, and then the entire system 30 can step to the next die (or next group).

Figure 14:
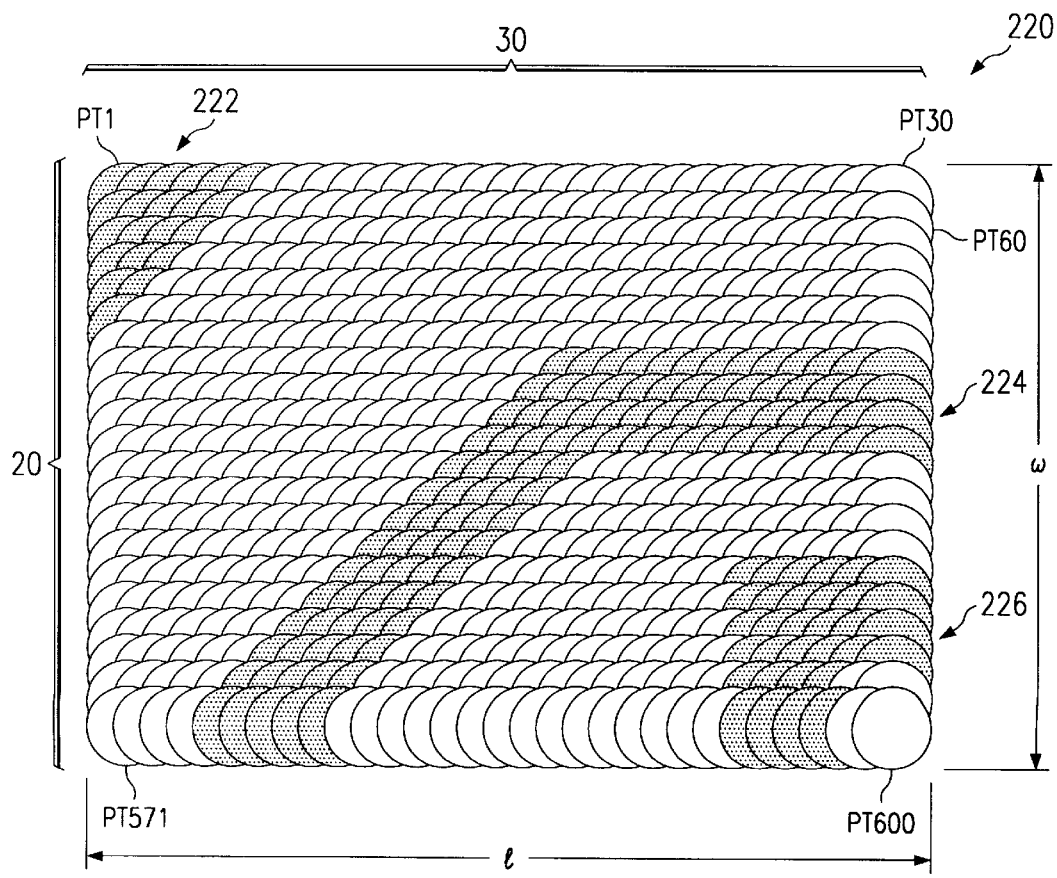
FIG. 14 illustrates a site that has been overlapping exposed 600 times.

The example of FIGS. 11–13 are limited in the number of pixel elements for the sake of clarity. In the figures, each focal point has a diameter of about ½ the length l or width w of the site 170a. Since N=4 in this example, the overlap spacing is relatively large and the focal points do not overlap very much, if at all. As the number of pixel elements increase (and thus N increases), the resolution and amount of overlapping increase, accordingly. For further example, FIG. 14 illustrates a site 220 that has been exposed by 600 pixel elements with focal points PT1–PT600 (e.g., from a 600×800 DMD). As can be seen, the focal points PT1–PT600 are arranged in an array (similar to equation 1, above) of:

$$(M,N) = 20 \text{ focal points} \times 30 \text{ focal points.} \quad (6)$$

By selectively turning ON and OFF the corresponding pixel elements, a plurality of structures 222, 224, 226 can be formed on the site 220. It is noted that structures 222–226 have good resolution and can be drawn to various different shapes, including diagonal. It is further noted that many of the focal points on the periphery of the site 220 will eventually overlap with focal points on adjacent sites. As such, the entire subject 42 can be covered by these sites.

Alternatively, certain focal points or other types of exposed sites can be overlapped to provide sufficient redundancy in the pixel panel 38. For example, the same 600 focal points of FIG. 14 can be used to produce an array of:

$$(M,N) = 20 \text{ focal points} \times 15 \text{ focal points.} \quad (7)$$

By duplicating the exposure of each focal point, this redundancy can accommodate one or more failing pixel elements in the pixel panel 38.

While the invention has been particularly shown and described with reference to the preferred embodiment thereof, it will be understood by those skilled in the art that various changes in form and detail may be made therein without departing form the spirit and scope of the invention. For example, multiple DMD pixel panels can be configured in a serial orientation. In this manner, light from the light source 32 can be projected to the first DMD, where it is reflected to the second DMD, where it is further reflected onto the subject 42. In this scenario, the second DMD can be used to generate the image to be exposed while the first DMD controls light uniformity according to simultaneous or previously mapped data. Therefore, the claims should be interpreted in a broad manner, consistent with the present invention.

What is claimed is:

1. A system for performing digital lithography onto a subject, the system comprising:

a pixel panel for generating a first pixel element from a digital image;

a point array for focusing the first pixel element onto a first site of the subject for exposure;

repositioning means for moving the subject in a first direction relative to the pixel panel so that a second pixel element aligns with the first site; and a digital imaging system for moving the digital image in the pixel panel responsive to the movement of the repositioning means and determining whether the second pixel element should be exposed;

whereby the point array exposes the second pixel element onto the first site of the subject if determined by the digital imaging system, and if exposed, whereby the subject exposure from the second pixel element overlaps a portion, but not all, of the subject exposure from the first pixel element to thereby create a line diagonal to the first direction.

2. The system of claim 1 wherein the first and second pixel elements of the pixel panel are linearly arranged, and the repositioning means moves the subject relative to the pixel panel at an angle to the linear arrangement of the elements.

3. The system of claim 1 wherein the point array is a microlense array.

4. A system for performing photolithography on a subject, the system comprising the steps of:

a digital pixel panel comprising a plurality of pixel elements;

a digital system for providing first and second digital patterns to the digital pixel panel;

an exposure system for exposing the plurality of pixel elements onto a plurality of sites of the subject, each of the sites having a length in one direction and a width in another direction; and a scanner for moving the subject in the one direction, relative to the digital pixel panel, a distance less than the length;

a controller for causing the digital system to sequentially provide the first and second digital patterns to the digital panel responsive to the scanner movement, so that the first and second digital patterns are sequentially exposed on the subject and at least one pixel element of the exposed second digital pattern overlaps a portion of at least one pixel element of the exposed first digital pattern;

wherein the scanner is also for moving the subject in the other direction, relative to the digital pixel panel, a distance less than the width;

wherein the digital system is also for providing a third digital image to the digital pixel panel; and wherein the controller is also for causing the digital system to sequentially provide the third digital pattern to the digital pixel panel after the second digital pattern, so that the third digital pattern is exposed after the second digital pattern, and at least one pixel element of the third digital pattern overlaps the at least one pixel element of the second digital pattern;

so that the exposure of the pixel elements creates a line diagonal to the length and width of the corresponding site.

5. The system of claim 4 wherein the third digital pattern also overlaps the at least one pixel element of the first digital pattern.

6. The system of claim 5 whereby the at least one exposed pixel element of the third digital pattern also overlaps the at least one pixel element of the second digital pattern.

7. The system of claim 4 wherein the first digital pattern is not being exposed while the second digital pattern is being exposed.

8. The system of claim 4 wherein the exposure system includes a point array device.

9. A system for performing photolithography on a subject, the system comprising:

a digital component for providing a first two dimensional digital pattern to a digital pixel panel comprising a first two dimensional plurality of pixel elements;

means for exposing the first plurality of pixel elements onto a two dimensional plurality of sites of the subject, the two dimensional plurality of sites arranged in columns and rows and each of the sites having a length in the column direction and a width in the row direction;

means for repositioning the subject in the column direction, relative to the first plurality of pixel elements, a distance less than the length;

the digital component also providing a second two dimensional digital pattern to the digital pixel panel comprising a second two dimensional plurality of pixel elements, after the exposure of the first plurality of pixel elements;

the means for exposing also exposing the second plurality of pixel elements onto the plurality of sites of the subject so that the exposed second plurality of pixel elements overlaps the exposed first plurality of pixel elements.

10. The system of claim 9 wherein:

the means for repositioning the subject further positions the subject in the other direction, relative to the first plurality of pixel elements, a distance less than the width;

the digital component also provides a third digital pattern to the digital pixel panel comprising a third plurality of pixel elements; and the means for exposing also exposes the third plurality of pixel elements onto the plurality of sites of the subject so that the third second plurality of pixel elements overlaps the exposed second plurality of pixel elements.

11. The system of claim 9 wherein:

the means for repositioning further positions the subject again in the column direction, relative to the first plurality of pixels elements, a distance less than the length;

the digital component also provides a third digital pattern to the digital pixel panel comprising a third plurality of pixel elements; and the means for exposing also exposes the third plurality of pixel elements onto the plurality of sites of the subject so that the exposed third plurality of pixel elements overlaps the exposed first plurality of pixel elements.

12. The system of claim 11 whereby the exposed third plurality of pixel elements also overlaps the exposed second plurality of pixel elements.

13. The system of claim 9 further comprising:

an optic element for reducing the first and second pixel elements to focal points during exposure, wherein each of the focal points cover a portion, but not all, of any of the plurality of sites.

* * * * *